(12) United States Patent
Xiong et al.

(10) Patent No.: US 10,973,127 B2
(45) Date of Patent: Apr. 6, 2021

(54) VOLTAGE REGULATOR MODULE

(71) Applicant: Delta Electronics, Inc., Taoyuan (TW)

(72) Inventors: Yahong Xiong, Taoyuan (TW); Da Jin, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/591,407

(22) Filed: Oct. 2, 2019

(65) Prior Publication Data

US 2020/0113057 A1 Apr. 9, 2020

Related U.S. Application Data

(60) Provisional application No. 62/743,251, filed on Oct. 9, 2018, provisional application No. 62/770,432, filed on Nov. 21, 2018.

(30) Foreign Application Priority Data

Dec. 12, 2018 (CN) .......................... 201811519362.6
Sep. 23, 2019 (CN) .......................... 201910901123.5

(51) Int. Cl.
*H05K 1/18* (2006.01)
*H01L 25/16* (2006.01)
(Continued)

(52) U.S. Cl.
CPC ............ *H05K 1/181* (2013.01); *H01L 25/16* (2013.01); *H01R 12/523* (2013.01); *H02M 1/00* (2013.01);
(Continued)

(58) Field of Classification Search
CPC ......... H05K 1/181; H02M 3/158; H01L 25/16
See application file for complete search history.

(56) References Cited

U.S. PATENT DOCUMENTS 5,229,916 A 7/1993 Frankeny et al.
5,515,604 A 5/1996 Horine et al.
(Continued)

FOREIGN PATENT DOCUMENTS

CN 103298258 A 9/2013
CN 203368934 U 12/2013
(Continued)

*Primary Examiner* — Mukundbhai G Patel
(74) *Attorney, Agent, or Firm* — Kirton McConkie; Evan R. Witt

(57) ABSTRACT

A voltage regulator module includes a first circuit board assembly, a second circuit board assembly and a magnetic core assembly. The first circuit board assembly includes a first printed circuit board. The second circuit board assembly includes a second printed circuit board, at least one output capacitor, a plurality of ball grid arrays and at least one bonding pad. The second printed circuit board includes a first surface and a second surface. The plurality of ball grid arrays are disposed on the second surface of the second printed circuit board. The at least one bonding pad is arranged beside the first surface of the second printed circuit board. The magnetic core assembly is arranged between the first circuit board assembly and the second circuit board assembly and electrically connected with the at least one bonding pad. The at least one output capacitor is embedded within the second circuit board assembly.

17 Claims, 15 Drawing Sheets

(51) Int. Cl.
*H01R 12/52* (2011.01)
*H02M 1/00* (2006.01)
*H02M 3/158* (2006.01)
*H05K 1/02* (2006.01)
*H05K 1/11* (2006.01)

(52) U.S. Cl.
CPC .......... *H02M 3/158* (2013.01); *H05K 1/0204* (2013.01); *H05K 1/111* (2013.01); *H02M 2001/0048* (2013.01); *H05K 2201/042* (2013.01); *H05K 2201/1003* (2013.01); *H05K 2201/10015* (2013.01); *H05K 2201/10166* (2013.01); *H05K 2201/10454* (2013.01)

(56) References Cited

U.S. PATENT DOCUMENTS

| | | | |
|---|---|---|---|
| 9,263,177 B1 | 2/2016 | Ikriannikov et al. | |
| 9,729,059 B1 * | 8/2017 | Parto | H02M 3/00 |
| 2004/0113741 A1 | 6/2004 | Li et al. | |
| 2005/0168961 A1 | 8/2005 | Ono et al. | |
| 2009/0201624 A1 | 8/2009 | Hattori et al. | |
| 2009/0231885 A1 | 9/2009 | Won et al. | |
| 2010/0259882 A1 | 10/2010 | Song | |
| 2010/0321140 A1 | 12/2010 | Tanaka et al. | |
| 2011/0148560 A1 | 6/2011 | Ikriannikov | |
| 2011/0234196 A1 | 9/2011 | Chiba | |
| 2011/0317387 A1 * | 12/2011 | Pan | H05K 1/165 361/782 |
| 2013/0049730 A1 | 2/2013 | Kato | |
| 2016/0086723 A1 | 3/2016 | Su et al. | |
| 2018/0122562 A1 | 5/2018 | Ji et al. | |
| 2018/0323702 A1 | 11/2018 | Zhou et al. | |
| 2019/0354154 A1 * | 11/2019 | Yates | G06F 1/26 |

FOREIGN PATENT DOCUMENTS

| | | |
|---|---|---|
| CN | 104603941 A | 5/2015 |
| CN | 105425918 A | 3/2016 |
| CN | 105487619 A | 4/2016 |
| CN | 206877816 U | 1/2018 |
| CN | 206961615 U | 2/2018 |
| CN | 108022917 A | 5/2018 |
| CN | 108288919 A | 7/2018 |
| CN | 108447841 A | 8/2018 |
| CN | 108811320 A | 11/2018 |
| CN | 108880283 A | 11/2018 |
| WO | 2010053821 A2 | 5/2010 |

* cited by examiner

VOLTAGE REGULATOR MODULE

CROSS-REFERENCE TO RELATED APPLICATION

This application claims the benefit of U.S. Provisional Application Ser. No. 62/743,251 filed on Oct. 9, 2018, claims the benefit of U.S. Provisional Application Ser. No. 62/770,432 filed on Nov. 21, 2018, claims priority to China Patent Application No. 2018/11519362.6 filed on Dec. 12, 2018, and claims priority to China Patent Application No. 2019/10901123.5 filed on Sep. 23, 2019, the entire contents of which are incorporated herein by reference for all purposes.

FIELD OF THE INVENTION

The present disclosure relates to a voltage regulator module, and more particularly to a voltage regulator module capable of reducing loss, increasing heat dissipation efficiency, withstanding increased pressure, disposing more output capacitors therein and/or decreasing the volume thereof.

BACKGROUND OF THE INVENTION

Please refer to FIGS. 1A and 1B. FIG. 1A schematically illustrates the structure of a conventional electronic device. FIG. 1B schematically illustrates the structure of a voltage regulator module of the electronic device as shown in FIG. 1A. As shown in FIGS. 1A and 1B, the electronic device 1 includes a central processing unit (CPU) 11, a voltage regulator module 12 and a system board 13. The voltage regulator module 12 is used for converting an input voltage into a regulated voltage and providing the regulated voltage to the central processing unit 11. The voltage regulator module 12 and the central processing unit 11 are disposed on a first surface of the system board 13. For meeting the load dynamic switching requirements, the output terminal of the voltage regulator module 12 is located near the input terminal of the central processing unit 11.

Moreover, the voltage regulator module 12 further includes an output capacitor 14, a printed circuit board 15 and a magnetic element 16. The output capacitor 14 is disposed on a second surface of the system board 13. The first surface and the second surface of the system board 13 are opposed to each other. The output capacitor 14 is located beside the input terminal of the central processing unit 11. The magnetic element 16 is disposed on the printed circuit board 15. Moreover, a switch element is disposed in a vacant space between the printed circuit board 15 and the magnetic element 16. The printed circuit board 15 is disposed on the first surface of the system board 13. The heat from the voltage regulator module 12 can be transferred to the system board 13 through the printed circuit board 15. Moreover, the heat is dissipated away through a heat dissipation mechanism (not shown) of the system board 13.

Recently, the required current for the central processing unit 11 is gradually increased. In addition, the trend of the volume of the electronic device is toward miniaturization. Since the central processing unit 11 and the voltage regulator module 12 are located at the same side of the system board 13, the electronic device cannot meet the load dynamic switching requirements.

For reducing the volume of the electronic device and effectively enhancing the dynamic switching performance of the voltage regulator module, another electronic device is disclosed. FIG. 2 schematically illustrates the structure of another conventional electronic device. In the electronic device 1' of FIG. 2, the voltage regulator module 12 is disposed on the second surface of the system board 13. That is, the voltage regulator module 12 is located at the position of the output capacitor 14 as shown in FIG. 1A. Under this circumstance, the voltage regulator module 12 and the central processing unit 11 are located at opposite sides of the system board 13. Correspondingly, the layout of the inner components of the voltage regulator module 12 needs to be adjusted. For example, the installation position of the output capacitor is changed from the second surface of the system board 13 to the inner space of the voltage regulator module 12. Consequently, the volume of the electronic device 1' is effectively reduced. Moreover, the output capacitor 14 is located near the output terminal of the voltage regulator module 12 and the input terminal of the central processing unit 11, the dynamic switching performance of the voltage regulator module 12 is enhanced.

Although the dynamic switching performance of the voltage regulator module 12 of the electronic device 1' as shown in FIG. 2 is enhanced, there are still some drawbacks. For example, the first side of the voltage regulator module 12 is welded on the system board 13, and the second side of the voltage regulator module 12 is fixed on the casing of the electronic device 1' through a heat sink and spring screws. Firstly, the heat from the voltage regulator module 12 cannot be effectively transferred to the casing of electronic device 1' and dissipated away through the casing of the electronic device 1'. Secondly, the voltage regulator module 12 is unable to withstand the pressure from the heat sink and the spring screws. As mentioned above, the output capacitor is disposed within the voltage regulator module. Thirdly, a plurality of ball grid arrays are usually mounted on the printed circuit board of the voltage regulator module 12. In case that the force applied to the ball grid arrays is not uniform, the soldering material is possibly cracked or detached and the product reliability is impaired. For solving this problem, the surface of the printed circuit board of the voltage regulator module 12 has to provide a large space for improving the force on the ball grid arrays. However, the installation space of the output capacitor is restricted. That is, the voltage regulator module 12 cannot be equipped with more output capacitors according to the practical requirements. Fourthly, the voltage regulator module includes a plurality of components for transferring signals. For example, a signal communication part composed of a plurality of pins is disposed within the voltage regulator module 12. The plurality of pins of the signal communication part are mounted on the printed circuit board of the voltage regulator module 12. Since the gap between every two pins of the signal communication part is large, the number of pins mounted on the given area is limited. That is, the distribution density of the pins is low. Moreover, since the cross-section area of each pin is small, the reliability of mounting the pin is usually unsatisfied. In case that the soldering materials between the pins are connected, a short-circuited problem occurs.

Therefore, there is a need of providing an improved voltage regulator module in order to overcome the drawbacks of the conventional technologies.

SUMMARY OF THE INVENTION

An object of the present disclosure provides a voltage regulator module capable of effectively transferring the heat to a casing of an electronic device, dissipating the heat through the casing and effectively withstanding the pressure from a heat sink and spring screws.

Another object of the present disclosure provides a voltage regulator module. The printed circuit board of the voltage regulator module is equipped with ball grid arrays. The printed circuit board has a sufficient space for effectively installing output capacitors. Consequently, more output capacitors can be disposed on the printed circuit board.

A further object of the present disclosure provides a voltage regulator module. The voltage regulator module has a conduction circuit board and a plurality of conduction fingers disposed on the conduction circuit board for transferring signals so as to replace the pins employed in prior arts. Consequently, the pin distribution density formed by the conduction fingers is increased, the volume of the voltage regulator module is decreased, and the power density of the voltage regulator module is increased. In addition, more space is provided to mount more separate components.

In accordance with an aspect of the present disclosure, a voltage regulator module is provided. A voltage regulator module includes a first circuit board assembly, a second circuit board assembly and a magnetic core assembly. The first circuit board assembly includes a first printed circuit board. The second circuit board assembly includes a second printed circuit board, at least one output capacitor, a plurality of ball grid arrays and at least one bonding pad. The second printed circuit board includes a first surface and a second surface. The plurality of ball grid arrays are disposed on the second surface of the second printed circuit board. The at least one bonding pad is arranged beside the first surface of the second printed circuit board. The magnetic core assembly is arranged between the first circuit board assembly and the second circuit board assembly and electrically connected with the at least one bonding pad. The at least one output capacitor is embedded within the second circuit board assembly.

From the above descriptions, the present disclosure provides a voltage regulator module. The U-shaped copper structures are penetrated through the magnetic core portion to define the inductors. Since the U-shaped copper structure has good supporting property and thermal conductivity, the U-shaped copper structure can be arranged between the first circuit board assembly and the second circuit board assembly to support the first circuit board assembly and the second circuit board assembly. Consequently, the capability of the voltage regulator module to withstand the pressure from the casing of the electronic device will be enhanced. Due to the good thermal conductivity of copper, the heat from the inductor can be transferred rapidly and effectively. Consequently, the thermal resistance in the thermal conduction path is decreased.

Moreover, the output capacitor is embedded within the second printed circuit board or encapsulated on the second printed circuit board. Consequently, the areas of the bonding pads on the second printed circuit board to weld the magnetic core assembly will be increased. Since the pressure applied to the ball grid arrays of the second printed circuit board is distributed more uniformly, the product reliability is enhanced and more output capacitors can be mounted on the second printed circuit board. The signal communication part includes a conduction circuit board with a plurality of conduction fingers and a plurality of surface pins. While the signal communication part is welded on the bonding pads of the first circuit board assembly or the second circuit board assembly, the lateral solder wicking efficacy is achieved and the soldering material is not spread to the adjacent pins. Since the soldering materials between the two surface pins are not connected, the short-circuited problem is avoided. Under this circumstance, the gap between the adjacent surface pins of the signal communication part is reduced, and the pins distribution density is increased. Consequently, the volume of the voltage regulator module is reduced, and power density of the voltage regulator module is enhanced.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
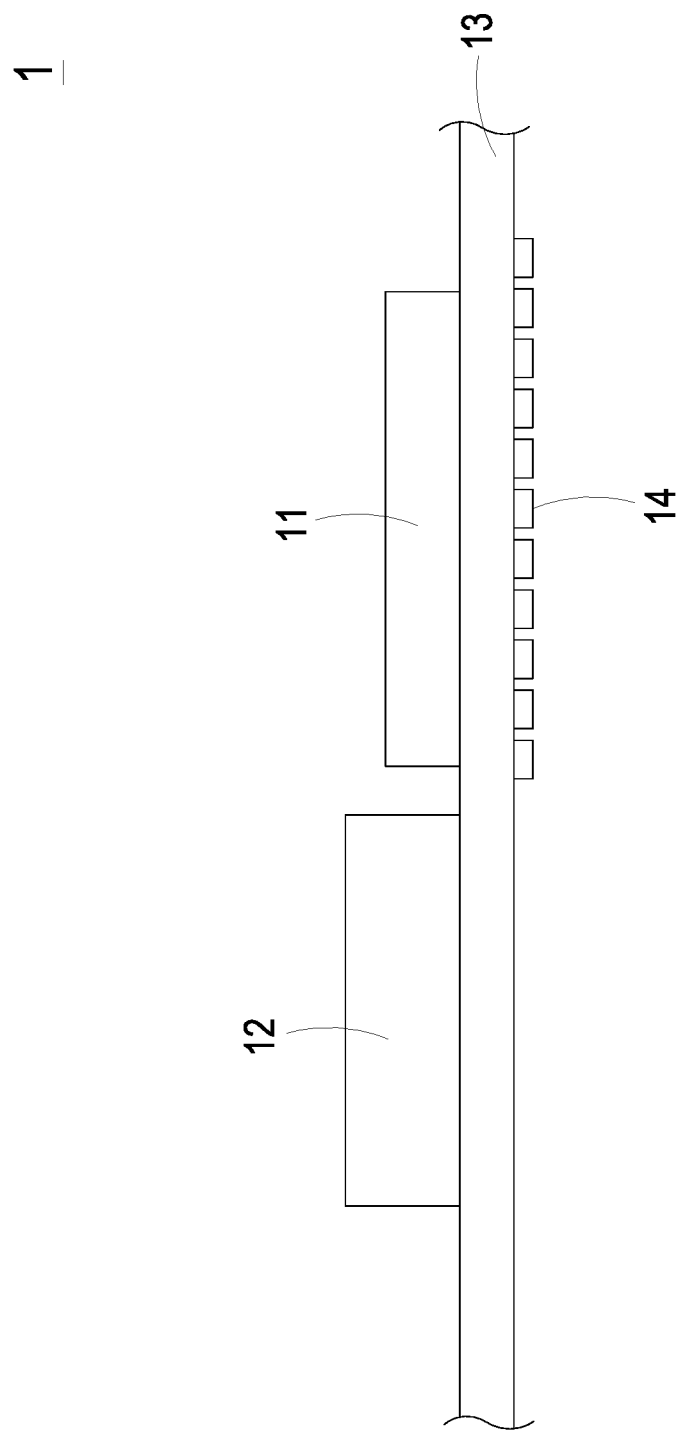
FIG. 1A schematically illustrates the structure of a conventional electronic device.
Figure 1B:
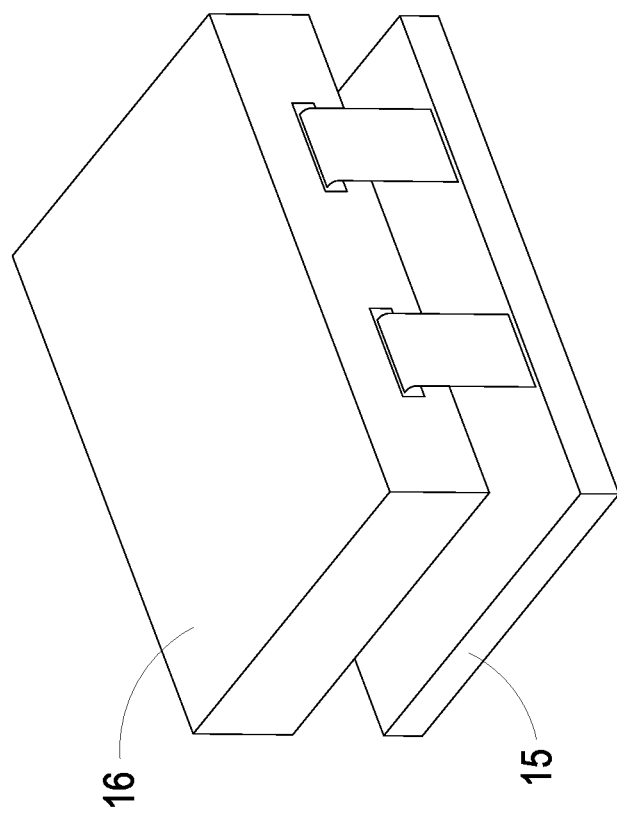
FIG. 1B schematically illustrates the structure of a voltage regulator module of the electronic device as shown in FIG. 1A.
Figure 2:
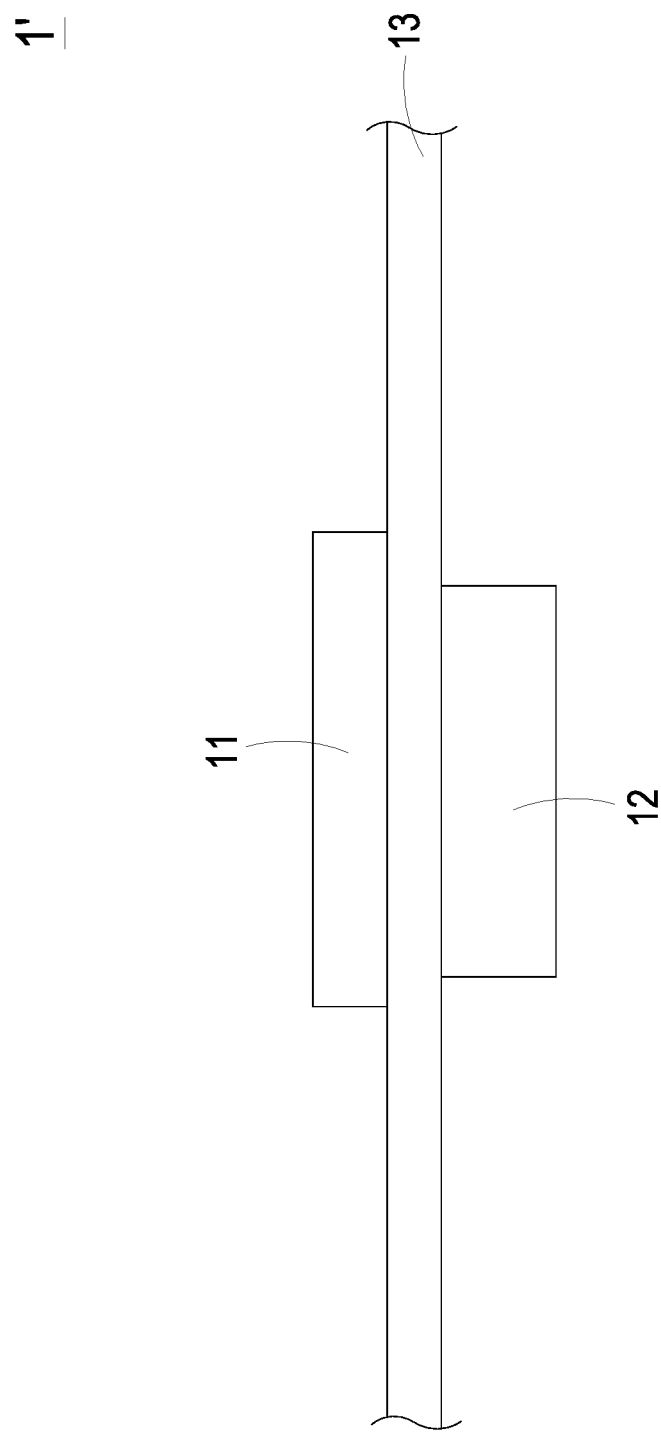
FIG. 2 schematically illustrates the structure of another conventional electronic device.
Figure 3A:
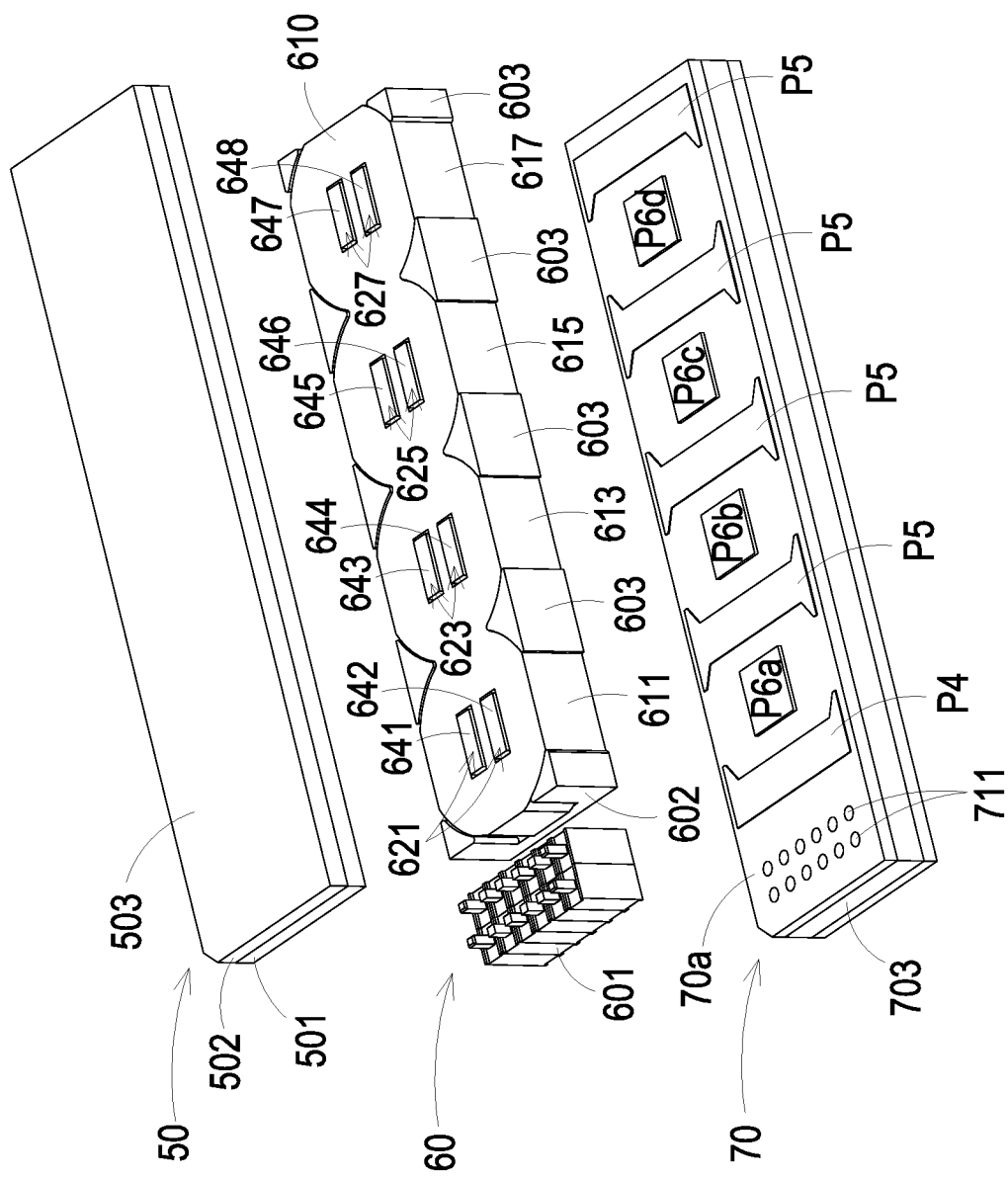
FIG. 3A is a schematic exploded view illustrating a voltage regulator module according to a first embodiment of the present disclosure and taken along a viewpoint.
Figure 3B:
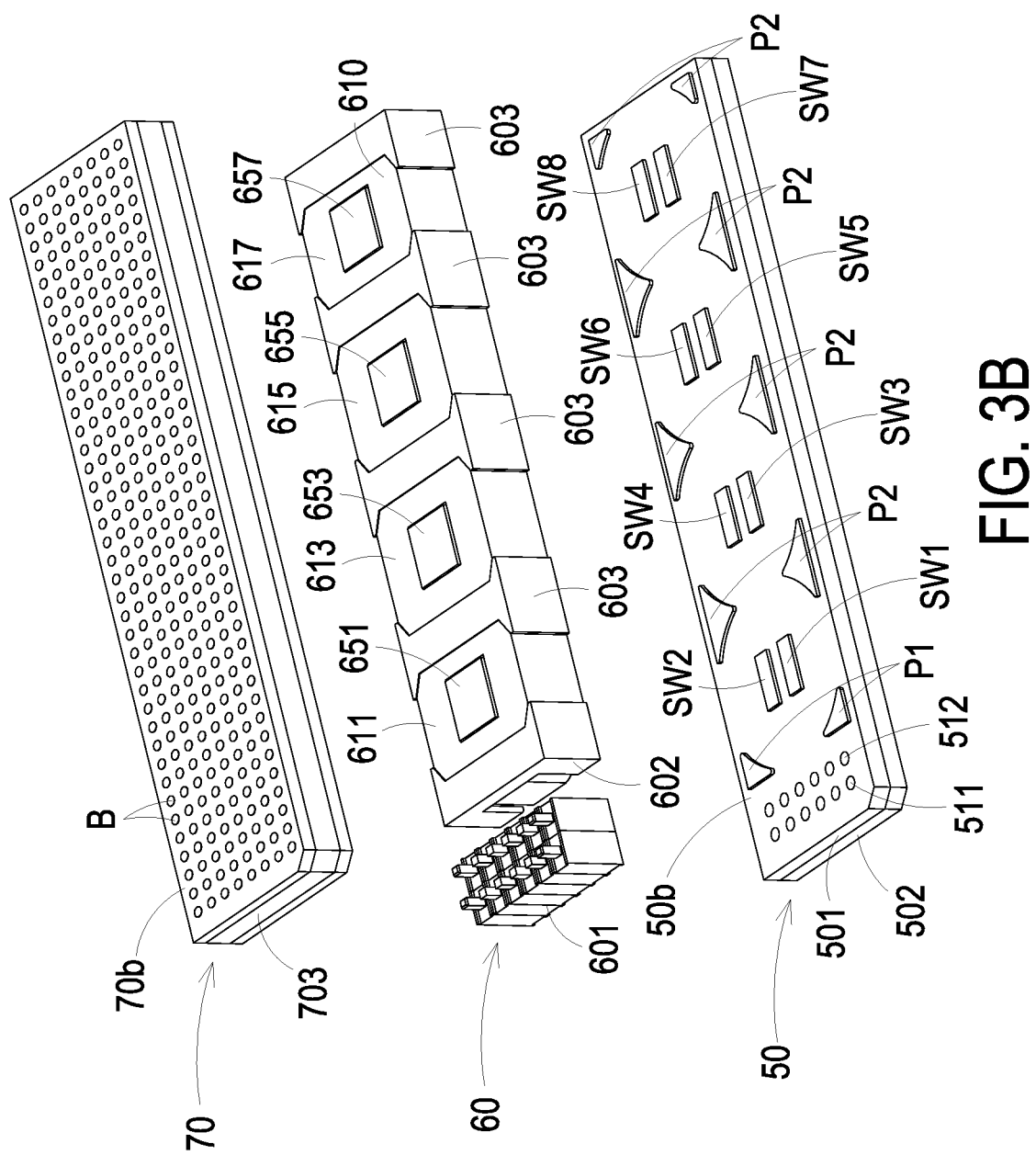
FIG. 3B is a schematic exploded view illustrating the voltage regulator module of FIG. 3A and taken along another viewpoint.
Figure 4:
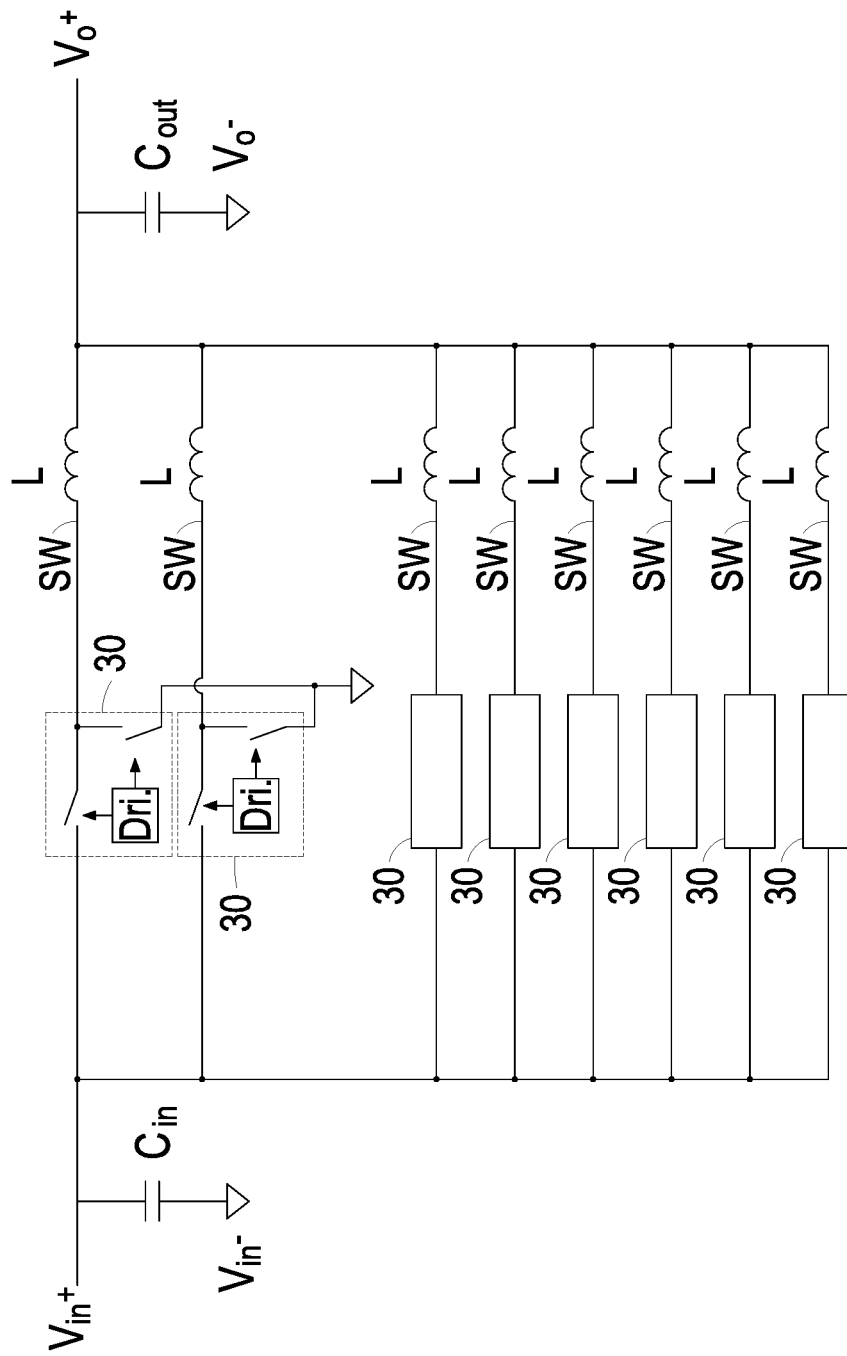
FIG. 4 is a schematic equivalent circuit diagram illustrating the voltage regulator module of FIG. 3A.
Figure 4:
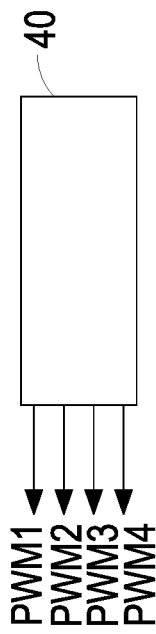

Please refer to FIGS. 3A, 3B and 4. FIG. 3A is a schematic exploded view illustrating a voltage regulator module according to a first embodiment of the present disclosure and taken along a viewpoint. FIG. 3B is a schematic exploded view illustrating the voltage regulator module of FIG. 3A and taken along another viewpoint. FIG. 4 is a schematic equivalent circuit diagram illustrating the voltage regulator module of FIG. 3A. The voltage regulator module 3 may be installed in an electronic device. In case that the central processing unit of the electronic device requires a large amount of current, the voltage regulator module 3 is a multi-phase buck converter. Consequently, the capability of the voltage regulator module 3 to output electricity is effectively enhanced. The voltage regulator module 3 includes a plurality of switch elements 30, a plurality of inductors L, at least one input capacitor Cin and at least one output capacitor Cout. For example, the switch elements 30 are driver and metal-oxide-semiconductor field-effect transistors (also referred as a Dr.MOS element).

As shown in FIG. 4, each Dr.MOS element 30 and a first terminal SW of the corresponding inductor L are electrically connected with each other in series to define a phase buck circuit. In this embodiment, the voltage regulator module 3 includes eight phase buck circuits, i.e., the first phase buck circuit to the eighth phase buck circuit from top to bottom. In other words, the voltage regulator module 3 includes eight Dr.MOS elements 30 and eight inductors L. The input side of the voltage regulator module 3 includes a positive input end Vin+ and a negative input end Vin−. The first terminals of the eight phase buck circuits are connected with each other in parallel and electrically connected with the input capacitor Cin. The output side of the voltage regulator module 3 includes a positive output terminal Vo+ and a negative output terminal Vo−. The negative input end Vin− and the negative output terminal Vo− are electrically connected with a common terminal. The second terminals of the eight phase buck circuits are connected with each other in parallel and electrically connected with the output capacitor Cout. A first terminal of the output capacitor Cout is electrically connected with the positive output terminal Vo+ of the voltage regulator module 3. A second terminal of the output capacitor Cout is electrically connected with the negative output terminal Vo− of the voltage regulator module 3. A first terminal of the input capacitor Cin is electrically connected with the positive input end Vin+ of the voltage regulator module 3. A second terminal of the input capacitor Cin is electrically connected with the negative input end Vin− of the voltage regulator module 3.

In an embodiment, each Dr.MOS element 30 includes a switch and a driver for driving the switch. The Dr.MOS element 30 has a heat dissipation surface for dissipating heat along a single side. Moreover, the voltage regulator module 3 further includes a control circuit 40. After the control circuit 40 samples the output voltage of the voltage regulator module 3 and the output current of each phase buck circuit, the control circuit 40 generates four pulse width modulation signals PWM1, PWM2, PWM3 and PWM4. The phase difference between every two adjacent pulse width modulation signals is 90 degree. Every two adjacent phase buck circuits are controlled by the control circuit 40 according to one pulse width modulation signal. For example, the first phase buck circuit and the second phase buck circuit are controlled according to the first pulse width modulation signal PWM1, the third phase buck circuit and the fourth phase buck circuit are controlled according to the second pulse width modulation signal PWM2, the fifth phase buck circuit and the sixth phase buck circuit are controlled according to the third pulse width modulation signal PWM3, and the seventh phase buck circuit and the eighth phase buck circuit are controlled according to the fourth pulse width modulation signal PWM4.

In accordance with a feature of the present disclosure, the voltage regulator module 3 is a multi-layered structure with more than two layers. Consequently, the ability of the voltage regulator module 3 to withstand the pressure from the casing of the electronic device is increased, and the heat from the voltage regulator module 3 is effectively transferred to the casing or the heat sink of the electronic device. In the embodiment as shown in FIGS. 3A and 3B, the voltage regulator module 3 is a three-layered structure comprising a first circuit board assembly 50, a magnetic core assembly 60 and a second circuit board assembly 70. The first circuit board assembly 50 includes a first printed circuit board 501 and a first molding compound layer 502. All Dr.MOS elements 30 and all input capacitors Cin are mounted on a first surface 50a of the first printed circuit board 501 by a welding process or through a conductive adhesive (see FIG. 3D). The heat dissipation surfaces of the Dr.MOS elements 30 are in contact with the first surface 50a of the first printed circuit board 501. The first molding compound layer 502 is disposed on the first surface 50a of the first printed circuit board 501. The first surface 50a of the first printed circuit board 501, the Dr.MOS elements 30 and the input capacitors Cin are encapsulated by the first molding compound layer 502 through a plastic molding process. An external surface 503 of the first molding compound layer 502 is a flat surface. The external surface 503 is attached and fixed on a casing or a heat sink of the electronic device. Since the external surface 503 is a flat surface, the contact area between the external surface 503 and the casing (or the heat sink) is increased. The increased contact area is helpful to reduce the thermal resistance, increase the heat dissipating capability of the voltage regulator module 3, uniformly distribute the pressure from the casing and increase the pressure resistance of the first circuit board assembly 50.

As shown in FIG. 3B, two first bonding pads P1, four pairs of second bonding pads P2, an even number of third bonding pads, a plurality of perforations 511 and at least one blind hole 512 are disposed on a second surface 50b of the first printed circuit board 501. The first bonding pads P1 are electrically connected with the positive input end Vin+ of the voltage regulator module 3. The second bonding pads P2 are electrically connected with the negative output terminal Vo− of the voltage regulator module 3. In this embodiment, the even number of third bonding pads include eight third bonding pads SW1, SW2, SW3, SW4, SW5, SW6, SW7 and SW8. Each third bonding pad is electrically connected with the first terminal SW of the corresponding inductor L. The perforations 511 run through the first printed circuit board 501. The blind hole 512 does not run through the first printed circuit board 501.

Figure 3C:
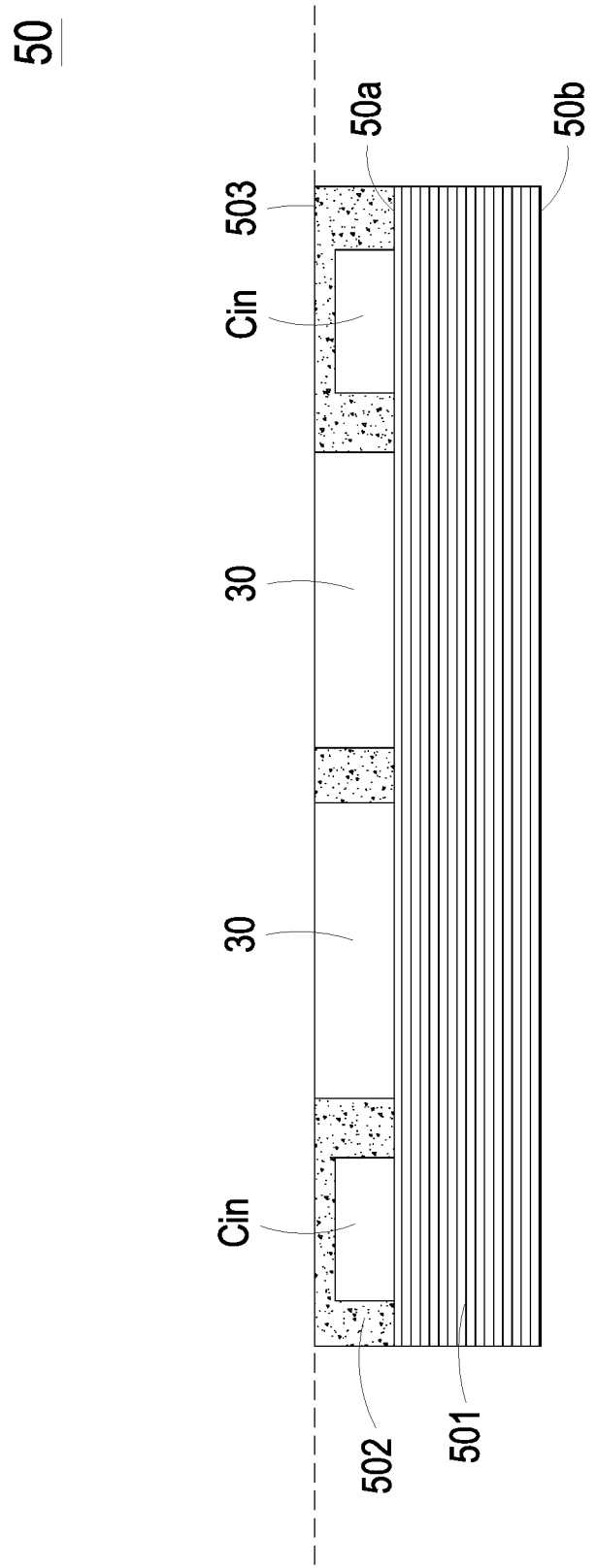
FIG. 3C is a schematic cross-sectional view illustrating a variant example of a first circuit board assembly of the voltage regulator module according to the first embodiment of the present disclosure.

It is noted that numerous modifications and alterations may be made while retaining the teachings of the disclosure. FIG. 3C is a schematic cross-sectional view illustrating a variant example of a first circuit board assembly of the voltage regulator module according to the first embodiment of the present disclosure. In this embodiment, each Dr.MOS element 30 has a first heat dissipation surface and a second heat dissipation surface, which are opposed to each other. Consequently, the heat can be dissipated along bilateral sides. The first heat dissipation surface is in contact with the first surface 50a of the first printed circuit board 501. After the first surface 50a of the first printed circuit board 501, the Dr.MOS elements 30 and the input capacitors Cin are encapsulated by the first molding compound layer 502, the external surface 503 of the first molding compound layer 502 is polished. Consequently, the second heat dissipation surfaces of the Dr.MOS elements 30 are exposed outside the external surface 503 of the first molding compound layer 502. Then, the Dr.MOS elements 30 are indirectly attached on the casing of the electronic device through a heat sink or directly attached on the casing of the electronic device. In such way, the thermal resistance is reduced, and the heat dissipating efficacy is enhanced.

Figure 3D:
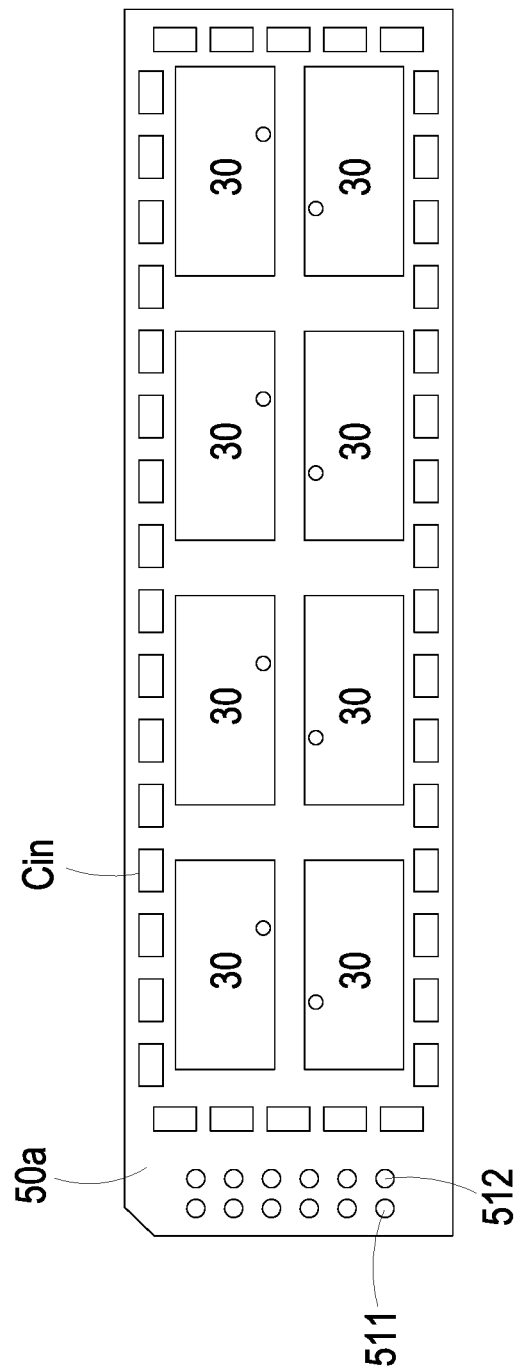
FIG. 3D schematically illustrates the layout structure of the electronic components on the first surface of the first printed circuit board of the voltage regulator module according to the first embodiment of the present disclosure.

FIG. 3D schematically illustrates the layout structure of the electronic components on the first surface of the first printed circuit board of the voltage regulator module according to the first embodiment of the present disclosure. As shown in FIG. 3D, the eight Dr.MOS elements 30 are divided into two rows. The four Dr.MOS elements 30 in the first row and the four Dr.MOS elements 30 in the second row are mounted on the first surface 50a of the first printed circuit board 501. The installation directions of the four Dr.MOS elements 30 in the first row are identical. The installation directions of the four Dr.MOS elements 30 in the second row are identical. Moreover, the installation directions of the four Dr.MOS elements 30 in the first row and the installation directions of the four Dr.MOS elements 30 in the second row are opposite. In this design, the wires between the eight Dr.MOS elements 30 and the first terminals SW of the corresponding inductors L are shorter. The input capacitors Cin are uniformly distributed around the Dr.MOS elements 30.

Please refer to FIGS. 3A and 3B again. The magnetic core assembly 60 is arranged beside the first circuit board assembly 50. In this embodiment, the magnetic core assembly 60 is located under the first circuit board assembly 50 and arranged beside the second surface 50b of the first printed circuit board 501. The magnetic core assembly 60 includes a magnetic core portion 610 and at least one first U-shaped copper structure. Each first U-shaped copper structure is penetrated through the magnetic core portion 610. Consequently, two inductors are defined by the magnetic core portion 610 and the two lateral posts of the first U-shaped copper structure. In this embodiment, the voltage regulator module 3 includes eight phase buck circuits. That is, the voltage regulator module 3 includes eight inductors L. As shown in FIGS. 3A and 3B, the magnetic core assembly 60 includes four first U-shaped copper structures 621, 623, 625 and 627. The eight lateral posts of the four first U-shaped copper structures 621, 623, 625 and 627 are correlated to the eight windings of the eight inductors L.

As mentioned above, each first U-shaped copper structure is penetrated through the magnetic core portion 610 to define two inductors L. Consequently, the eight inductors L are defined by four first U-shaped copper structures. Under this circumstance, the number of the first U-shaped copper structures is decreased. Moreover, since the U-shaped copper structure has good supporting property and thermal conductivity, the U-shaped copper structure can be arranged between the first circuit board assembly 50 and the second circuit board assembly 70 to support the first circuit board assembly 50 and the second circuit board assembly 70. Consequently, the capability of the voltage regulator module 3 to withstand the pressure from the casing of the electronic device will be enhanced. Due to the good thermal conductivity of copper, the heat from the inductor L can be transferred rapidly and effectively. Consequently, the thermal resistance in the thermal conduction path is decreased. Due to low resistivity of copper, the conduction resistance of the inductor is decreased. Consequently, the conduction loss of the inductor is decreased, and the conversion efficiency of the voltage regulator module 3 is increased.

Please refer to FIGS. 3A, 3B and 4 again. The second circuit board assembly 70 includes a second printed circuit board 703 and at least one output capacitor Cout. Preferably but not exclusively, the at least one output capacitor Cout is embedded within the second printed circuit board 703. The second printed circuit board 703 includes a fourth bonding pad P4, four fifth bonding pads P5, four sixth bonding pads P6a, P6b, P6c, P6d, a plurality of blind holes 711 and a plurality of ball grid arrays (BGA) B. The fourth bonding pad P4, the four fifth bonding pads P5, the four sixth bonding pads P6a, P6b, P6c, P6d and the plurality of blind holes 711 are installed on/in a first surface 70a of the second printed circuit board 703. The first surface 70a of the second printed circuit board 703 is arranged beside the magnetic core assembly 60. The fourth bonding pad P4 is electrically connected with the positive input end Vin+ of the voltage regulator module 3. The four fifth bonding pads P5 are electrically connected with the negative output terminal Vo− of the voltage regulator module 3. The sixth bonding pads P6a, P6b, P6c and P6d are electrically connected with the positive output terminal Vo+ of the voltage regulator module 3. The plurality of ball grid arrays B are disposed on a second surface 70b of the second printed circuit board 703. The plurality of ball grid arrays B are electrically connected with the ball grid arrays of the central processing unit on the system board of the electronic device. Preferably, the gaps and networks of the plurality of ball grid arrays B on the second surface 70b of the second printed circuit board 703 correspond to those of the ball grid arrays on the system board. The plurality of ball grid arrays B are electrically connected with the plurality of bonding pads on the first surface 70a of the second printed circuit board 703 through the internal traces of the second printed circuit board 703.

Generally, the voltage regulator module 3 withstands the pressure from the electronic device because of screwing means or other reasons. In case that the first surface 70a of the second printed circuit board 703 is exerted by the pressure uniformly, the plurality of ball grid arrays B on the second surface 70b of the second printed circuit board 703 are exerted by the pressure uniformly. Whereas, in case that the ball grid arrays B are exerted by the pressure non-uniformly and some ball grid arrays B withstand the larger pressure, the soldering material is possibly cracked or detached and the product reliability is impaired. For solving this problem, the areas of the bonding pads on the first surface 70a of the second printed circuit board 703 to weld the magnetic core assembly 60 need to be increased. However, as the areas of the bonding pads are increased, the layout area for placing the output capacitors Cout is decreased. In accordance with the present disclosure, the output capacitors Cout are embedded or encapsulated. The approach of embedding or encapsulating the output capacitors Cout will be described as follows.

Figure 5:
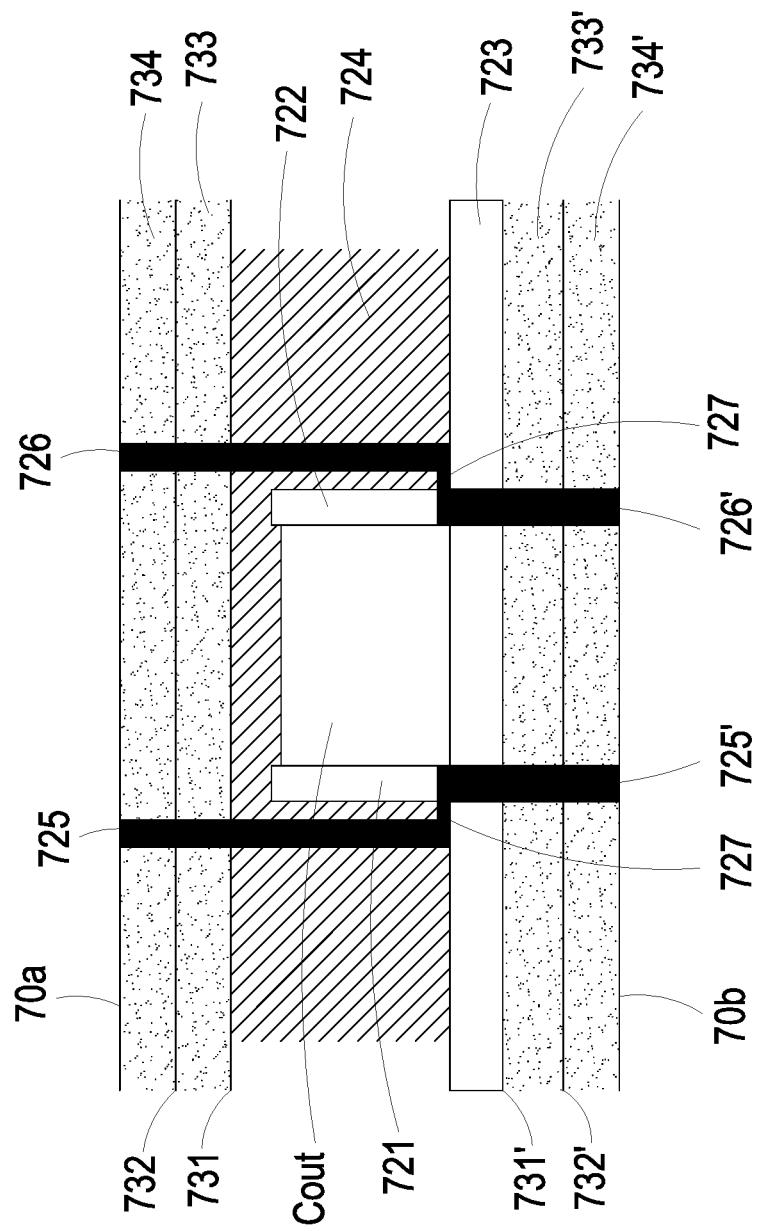
FIG. 5 is a schematic cross-sectional view illustrating an example of installing the output capacitor in the second printed circuit board according to the first embodiment of the present disclosure.

FIG. 5 is a schematic cross-sectional view illustrating an example of embedding the output capacitor in the second printed circuit board according to the first embodiment of the present disclosure. For succinctness, only one output capacitor Cout embedded in the second printed circuit board 703 is shown in FIG. 5. The second printed circuit board 703 includes a substrate 723, an interface layer 724, a plurality of first electroplating layers 731, 731', a plurality of second electroplating layers 732, 732', a plurality of first insulation layers 733, 733' and a plurality of second insulation layers 734, 734'.

The substrate 723 includes a plurality of bonding pads 727. The output capacitor Cout is welded on the corresponding bonding pads 727. That is, the output capacitor Cout is fixed on the substrate 723 through the bonding pads 727. For example, the interface layer 724 is made of AjinomotoBuild-up Film (ABF). The output capacitor Cout is mounted on a first surface of the substrate 723. The interface layer 724 is formed over the first surface of the substrate 723 and the output capacitor Cout. After the interface layer 724 is baked at a specified temperature (e.g., 180° C.) for a specified time period (e.g., 30 minutes), the interface layer 724 is solidified into an insulation layer.

The first electroplating layers 731 and 731' are copper layers that are laminated and electroplated on a top surface of the interface layer 724 and a second surface of the substrate 723, respectively. The thickness of the first electroplating layer 731 (and 731') is about 3 OZ. Moreover, two plated through holes are formed in the interface layer 724, and two plated through holes are formed in the substrate 723. The two plated through holes of the interface layer 724 and the two plated through holes of the substrate 723 are aligned with the two bonding pads 727, respectively. Moreover, the two plated through holes of the interface layer 724 and the two plated through holes of the substrate 723 are connected with each other through the two bonding pads 727, which are connected with the output capacitor Cout.

The first insulation layers 733 and 733' are formed on a top surface of the first electroplating layer 731 and a bottom surface of the first electroplating layer 731', respectively.

The second electroplating layers 732 and 732' are copper layers that are laminated and electroplated on a top surface of the first insulation layer 733 and a bottom surface of the first insulation layer 733', respectively. The thickness of the second electroplating layer 732 (and 732') is about 3 OZ. Moreover, two plated through holes are formed in the first insulation layer 733, and two plated through holes are formed in the first insulation layer 733'. The two plated through holes of the first insulation layer 733 are aligned and contacted with the two plated through holes of the interface layer 724 so that the two plated through holes of the first insulation layer 733 are connected with the two bonding pads 727, which are connected with the output capacitor Cout. The two plated through holes of the first insulation layer 733' are aligned and contacted with the two plated through holes of the substrate 723 so that the two plated through holes of the first insulation layer 733' are connected with the two bonding pads 727, which are connected with the output capacitor Cout.

The second insulation layers 734 and 734' are formed on a top surface of the second electroplating layer 732 and a bottom surface of the second electroplating layer 732', respectively. Two electroplating layers (i.e. two cooper layers) are laminated and electroplated on a top surface of the second insulation layer 734 and a bottom surface of the second insulation layer 734', respectively, so as to form a first surface 70a and a second surface 70b of the second printed circuit board 703. The thickness of the electroplating layer is about 3 OZ. Moreover, two plated through holes are formed in the second insulation layer 734, and two plated through holes are formed in the second insulation layer 734'. The two plated through holes of the second insulation layer 734 are aligned and contacted with the two plated through holes of the first insulation layer 733 so that the two plated through holes of the second insulation layer 734 are connected with the two plated through holes of the first insulation layer 733, the two plated through holes of the interface layer 724 and the two bonding pads 727, which are connected with the output capacitor Cout. The two plated through holes of the second insulation layer 734' are aligned and contacted with the two plated through holes of the first insulation layer 733' so that the two plated through holes of the second insulation layer 734' are connected with the two plated through holes of the first insulation layer 733', the two plated through holes of the substrate 723 and the two bonding pads 727, which are connected with the output capacitor Cout.

In the upper half and left side of the second printed circuit board assembly 70, one of the plated through holes of the second insulation layer 734, one of the plated through holes of the first insulation layer 733 and one of the plated through holes of the interface layer 724 are collaboratively defined as a first conducting line 725. In the lower half and left side of the second printed circuit board assembly 70, one of the plated through holes of the second insulation layer 734', one of the plated through holes of the first insulation layer 733' and one of the plated through holes of the substrate 723 are collaboratively defined as a first conducting line 725'. In the upper half and right side of the second printed circuit board assembly 70, the other one of the plated through holes of the second insulation layer 734, the other one of the plated through holes of the first insulation layer 733 and the other one of the plated through holes of the interface layer 724 are collaboratively defined as a second conducting line 726. In the lower half and right side of the second printed circuit board assembly 70, the other one of the plated through holes of the second insulation layer 734', the other one of the plated through holes of the first insulation layer 733' and the other one of the plated through holes of the substrate 723 are collaboratively defined as a second conducting line 726'. Namely, the plated through holes of the above layers in the left side are collaboratively defined as a first conducting line. The plated through holes of the above layers in the right side are collaboratively defined as a second conducting line. The first conducting line 725, 725' is electrically connected with the first terminal of the output capacitor Cout, the positive output terminal Vo+ of the voltage regulator module 3 and the first surface 70a and the second surface 70b of the second printed circuit board 703. The second conducting line 726, 726' is connected with the second terminal of the output capacitor Cout, the negative output terminal Vo− of the voltage regulator module 3 and the first surface 70a and the second surface 70b of the second printed circuit board 703. Since the output capacitors Cout are embedded in the second printed circuit board 703, the voltage regulator module 3 can be equipped with more output capacitors. In addition, the output capacitors Cout are not interfered by other components of the second printed circuit board 703.

Figure 6:
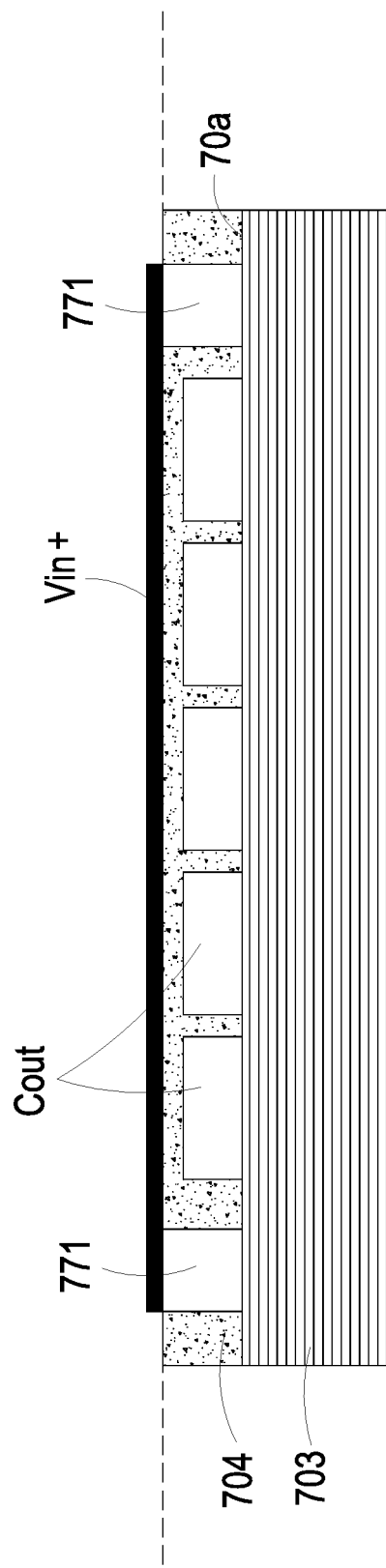
FIG. 6 is a schematic cross-sectional view illustrating an example of encapsulating the output capacitor in the second printed circuit board according to the first embodiment of the present disclosure.

FIG. 6 is a schematic cross-sectional view illustrating an example of encapsulating the output capacitor in the second printed circuit board according to the first embodiment of the present disclosure. In this embodiment, the output capacitor Cout is encapsulated in the second printed circuit board 703. As shown in FIG. 6, the output capacitor Cout is fixed on the first surface 70a of the second printed circuit board 703. The second circuit board assembly 70 further includes a plurality of copper blocks 771 and a second molding compound layer 704. The copper blocks 771 are fixed on the first surface 70a of the second printed circuit board 703 to provide a supporting function. The first surface 70a of the second printed circuit board 703, the output capacitor Cout and the plurality of copper blocks 771 are encapsulated by the second molding compound layer 704 through a plastic molding process.

In an embodiment, the copper blocks 771 are rectangular structures. Moreover, the top surfaces of the copper blocks 771 are exposed outside the top surface of the second molding compound layer 704 through natural exposure or a polishing process. The fourth bonding pad P4 is electroplated on the top surfaces of the second molding compound layer 704 and electrically connected with the corresponding copper blocks 771 exposed outside the second molding compound layer 704. The copper blocks 771 are higher than the output capacitor Cout. Consequently, after the plastic molding process, the top surfaces of the copper blocks 771 are exposed outside the top surface of the second molding compound layer 704 through natural exposure or the polishing process. Similarly, the four fifth bonding pads P5 and the four sixth bonding pads P6a, P6b, P6c, P6d may be electroplated on the top surface of the second molding compound layer 704 and electrically connected with the exposed copper blocks.

Figure 7:
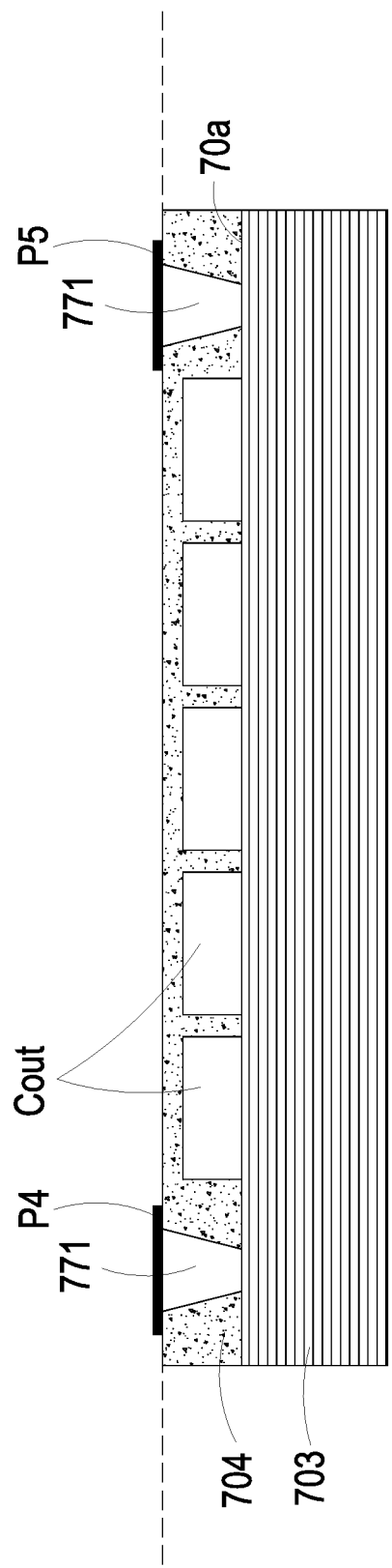
FIG. 7 is a schematic cross-sectional view illustrating a variant example of encapsulating the output capacitor in the second printed circuit board.

FIG. 7 is a schematic cross-sectional view illustrating a variant example of encapsulating the output capacitor in the second printed circuit board. In this embodiment, each of the copper blocks 771 is a trapezoidal column structure with a bottom surface and a top surface. The area of the bottom surface is smaller than the area of the top surface. The bottom surfaces of the trapezoidal column structures are fixed on the first surface 70a of the second printed circuit board 703. Moreover, the top surfaces of the trapezoidal column structures are exposed outside the top surface of the second molding compound layer 704 through natural exposure or a polishing process. The fourth bonding pad P4 and the fifth bonding pads P5 (and/or the sixth bonding pads P6a, P6b, P6c, P6d) are formed on the exposed copper blocks 771.

Preferably, the area of the top surface of the trapezoid column structure is at least 1.3 times the area of the bottom surface of the trapezoid column structure. In the embodiment of FIG. 6 or FIG. 7, the output capacitor Cout is encapsulated in the second printed circuit board 703. Since the top side of the second circuit board assembly 70 is a flat plane, the larger-size bonding pad can be formed on the flat plane and the contact area between the second circuit board assembly 70 and the magnetic core assembly 60 is increased. Since the area of the second circuit board assembly 70 to receive the pressure is increased, the pressure applied to the ball grid arrays B on the second surface 70b of the second printed circuit board 703 is distributed more uniformly. Under this circumstance, the product reliability is enhanced.

Figure 8:
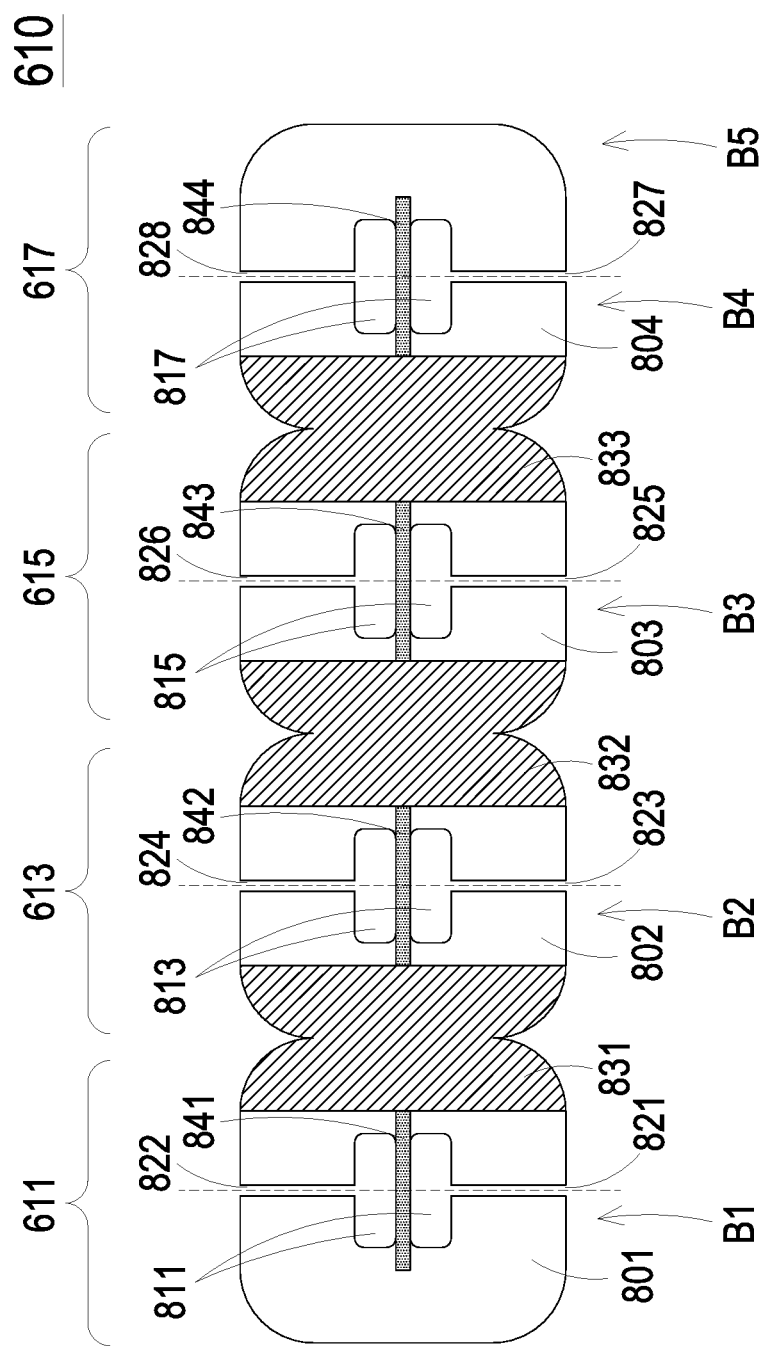
FIG. 8 is a schematic cross-sectional view illustrating the magnetic core portion of the magnetic core assembly of the voltage regulator module according to the first embodiment of the present disclosure.

Please refer to FIGS. 3A, 3B and 8. FIG. 8 is a schematic cross-sectional view illustrating the magnetic core portion of the magnetic core assembly of the voltage regulator module according to the first embodiment of the present disclosure. The magnetic core portion 610 includes four core units 611, 613, 615 and 617, which are connected with each other. Preferably but not exclusively, each of the core units 611, 613, 615 and 617 is a square core with four rounded corners. Alternatively, each core unit is a circular core. Two parallel openings 811 are formed in a middle region of the core unit 611. Two parallel openings 813 are formed in a middle region of the core unit 613. Two parallel openings 815 are formed in a middle region of the core unit 615. Two parallel openings 817 are formed in a middle region of the core unit 617. Preferably but not exclusively, the openings 811, 813, 815, 817 are square-shaped. The sizes and shapes of the openings 811, 813, 815 and 817 match the sizes and shapes of the lateral posts of the first U-shaped copper structures 621, 623, 625 and 627, respectively. The lateral posts of the first U-shaped copper structures 621, 623, 625 and 627 are respectively penetrated through the openings 811, 813, 815 and 817 to define eight inductors L. For example, the two lateral posts of the first U-shaped copper structure 621 are penetrated through the openings 811, respectively. Consequently, the inductor L of the first phase buck circuit and the inductor L of the second phase buck circuit are defined by the two lateral posts of the first U-shaped copper structure 621 and the core unit 611 collaboratively. The rest may be deduced by analogy.

The first U-shaped copper structure 621 includes two top surfaces 641 and 642 and a bottom surface 651. The two top surfaces 641 and 642 are fixed on and electrically connected with the two third bonding pads SW1 and SW2 on the second surface 50b of the first printed circuit board 501. The bottom surface 651 is fixed on and electrically connected with the sixth bonding pad P6a of the second circuit board assembly 70. The first U-shaped copper structure 623 includes two top surfaces 643 and 644 and a bottom surface 653. The two top surfaces 643 and 644 are fixed on and electrically connected with the two third bonding pads SW3 and SW4 on the second surface 50b of the first printed circuit board 501. The bottom surface 653 is fixed on and electrically connected with the sixth bonding pad P6b of the second circuit board assembly 70. The first U-shaped copper structure 625 includes two top surfaces 645 and 646 and a bottom surface 655. The two top surfaces 645 and 646 are fixed on and electrically connected with the two third bonding pads SW5 and SW6 on the second surface 50b of the first printed circuit board 505. The bottom surface 655 is fixed on and electrically connected with the sixth bonding pad P6c of the second circuit board assembly 70. The first U-shaped copper structure 627 includes two top surfaces 647 and 648 and a bottom surface 657. The two top surfaces 647 and 648 are fixed on and electrically connected with the two third bonding pads SW7 and SW8 on the second surface 50b of the first printed circuit board 507. The bottom surface 657 is fixed on and electrically connected with the sixth bonding pad P6d of the second circuit board assembly 70.

In the magnetic core portion 610, the magnetic field lines of every two adjacent core units 611, 613, 615, 617 are overlapped to create a first magnetic overlap region. For example, three first magnetic overlap regions 831, 832 and 833 indicated by oblique lines are shown in FIG. 8. In each core unit 611, 613, 615, 617, the magnetic field lines of every two inductors are overlapped to create a second magnetic overlap region. For example, four second magnetic overlap regions 841, 842, 843 and 844 are shown in FIG. 8. Each second magnetic overlap region is arranged between the two openings of the corresponding core unit. In the three first magnetic overlap regions 831, 832 and 833, the DC magnetic fluxes are balanced out and the AC magnetic fluxes are superposed. In the four second magnetic overlap regions 841, 842, 843 and 844, the DC magnetic fluxes are balanced out and the AC magnetic fluxes are balanced out. However, since the device parameters and the parasitic parameters of the two-phase buck circuits corresponding to the pulse width modulation signal are not always identical. Consequently, the DC magnetic fluxes and the AC magnetic fluxes in the four second magnetic overlap regions 841, 842, 843 and 844 cannot be completely balanced out. That is, a small amount of DC magnetic flux and a small amount of AC magnetic flux are retained. In some embodiments, the area of each first magnetic overlap region (e.g., 831, 832 or 833) is smaller than two times the area of the non-magnetic overlap region of each core unit (e.g., 801, 802, 803 or 804), and the area of each second magnetic overlap region (841, 842, 843 or 844) is smaller than a half area of the area of the non-magnetic overlap region of each core unit (e.g., 801, 802, 803 or 804). The overlap regions of FIG. 8 are presented herein for purpose of illustration and description only.

Each of the core units 611, 613, 615 and 617 includes two air gaps. The core unit 611 includes the two air gaps 821 and 822, which are symmetrically arranged at two opposite sides of the openings 811. The core unit 613 includes the two air gaps 823 and 824, which are symmetrically arranged at two opposite sides of the openings 813. The core unit 615 includes the two air gaps 825 and 826, which are symmetrically arranged at two opposite sides of the openings 815. The core unit 617 includes the two air gaps 827 and 828, which are symmetrically arranged at two opposite sides of the openings 817. These air gaps can withstand the magnetic pressure averagely. Preferably, the magnetic core portion 610 is an integral structure. Moreover, the combination of the magnetic core portion 610 and the first U-shaped copper structures 621, 623, 625 and 627 is installed between the first circuit board assembly 50 and the second circuit board assembly 70.

Please refer to FIGS. 3A and 3B. The magnetic core assembly 60 further includes a plurality of second U-shaped copper structures 603 and a third U-shaped copper structure 602. The two top surfaces of the third U-shaped copper structure 602 are welded on and electrically connected with the two first bonding pads P1 on the second surface 50b of the first printed circuit board 501. The bottom surface of the third U-shaped copper structure 602 is welded on and electrically connected with the fourth bonding pad P4 of the second circuit board assembly 70. The two top surfaces of each second U-shaped copper structure 603 are welded on and electrically connected with the corresponding two second bonding pads P2 on the second surface 50b of the first printed circuit board 501. The bottom surface of each second U-shaped copper structure 603 is welded on and electrically connected with the corresponding fifth bonding pad P5 of the second circuit board assembly 70.

The heights of the first U-shaped copper structures 621, 623, 625, 627, the second U-shaped copper structures 603 and the third U-shaped copper structure 602 are equal or substantially the same. Moreover, the shapes of the inner surfaces of the third U-shaped copper structure 602 and the second U-shaped copper structures 603 match the shape of the magnetic core portion 610. The outer surfaces of the third U-shaped copper structure 602 and the second U-shaped copper structures 603 are flat. The first U-shaped copper structures 621, 623, 625, 627, the second U-shaped copper structure 603 and the third U-shaped copper structure 602 are supported between the first circuit board assembly 50 and the second circuit board assembly 70. Consequently, the capability of the voltage regulator module 3 to withstand the pressure from the casing of the electronic device will be enhanced. Due to the good thermal conductivity of copper, the heat from the inductor L can be transferred to the second circuit board assembly 70 rapidly and effectively. Consequently, the thermal resistance in the thermal conduction path is decreased.

The first U-shaped copper structures 621, 623, 625, 627, the second U-shaped copper structures 603 and the third U-shaped copper structure 602 can provide the good supporting capability. Consequently, the magnetic core portion 610 may be slightly shorter than the first U-shaped copper structures 621, 623, 625, 627, the second U-shaped copper structures 603 and the third U-shaped copper structure 602. In this design, the pressure to be withstood by the magnetic core portion 610 is reduced. Consequently, the possibility of causing the crack of the magnetic core portion 610 by the large pressure will be minimized.

A process of assembling the magnetic core assembly 60 will be descried as follows. Firstly, the top surfaces of the first U-shaped copper structures 621, 623, 625, 627, the second U-shaped copper structures 603 and the third U-shaped copper structure 602 face upwardly. Then, the inner sides of the bottom surfaces of the first U-shaped copper structures 621, 623, 625, 627, the second U-shaped copper structures 603 and the third U-shaped copper structure 602 are dispensed with glue. Then, the first U-shaped copper structures 621, 623, 625, 627, the second U-shaped copper structures 603 and the third U-shaped copper structure 602 are locked on the magnetic core portion 610. Consequently, the magnetic core assembly 60 is assembled. Then, the magnetic core assembly 60 is combined with the first circuit board assembly 50 and the second circuit board assembly 70 through a welding process. Consequently, the voltage regulator module 3 is produced and the production process is simplified. In this embodiment, the shapes of the first U-shaped copper structures 621, 623, 625, 627, the second U-shaped copper structures 603 and the third U-shaped copper structure 602 are similar to that of the U-shaped magnetic cores of the conventional magnetic components. Therefore, the shapes of the U-shaped copper structures are not particularly shown in the drawings of the present disclosure.

Please refer to FIGS. 3A and 3B again. The voltage regulator module 3 further includes a signal communication part 601. The signal communication part 601 includes a plurality of pins. The plurality of pins are divided into a first pin group and a second pin group. The first terminals of the pins in the first pin group are fixed in the corresponding perforations 511 of the first printed circuit board 501 by welding. The first terminals of the pins in the second pin group are fixed in the blind holes 512 of the first printed circuit board 501 by welding. The second terminals of all pins are fixed in the corresponding blind holes 711 of the second printed circuit board 703 by welding. The signal communication part 601 is used for transferring the control signal between the first circuit board assembly 50 and the second circuit board assembly 70.

The uses of the perforations 511 are helpful for fixing the signal communication part 601. Due to the blind holes 512, the first surface 50a of the first printed circuit board 501 is retained to mount the separate components (e.g., the input capacitors Cin). Consequently, the voltage regulator module 3 can meet the high-power density requirements. Similarly, due to the blind holes 711, the second surface 70b of the second printed circuit board 703 is retained to mount more ball grid arrays B and the inner space of the second printed circuit board 703 is retained to accommodate more separate components (e.g., the output capacitors Cout).

Figure 9A:
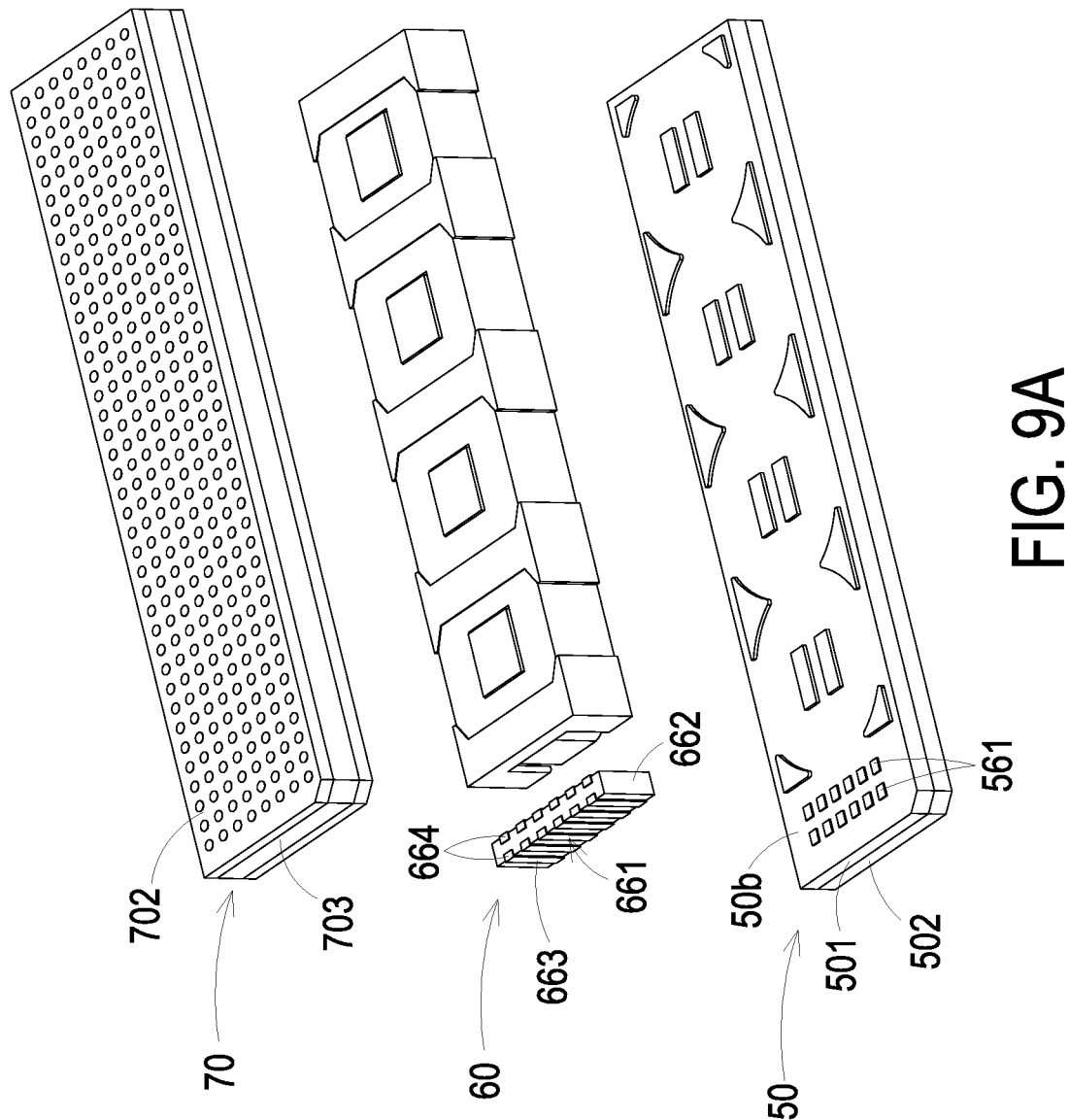
FIG. 9A is a schematic exploded view illustrating a voltage regulator module according to a second embodiment of the present disclosure and taken along a viewpoint.
Figure 9B:
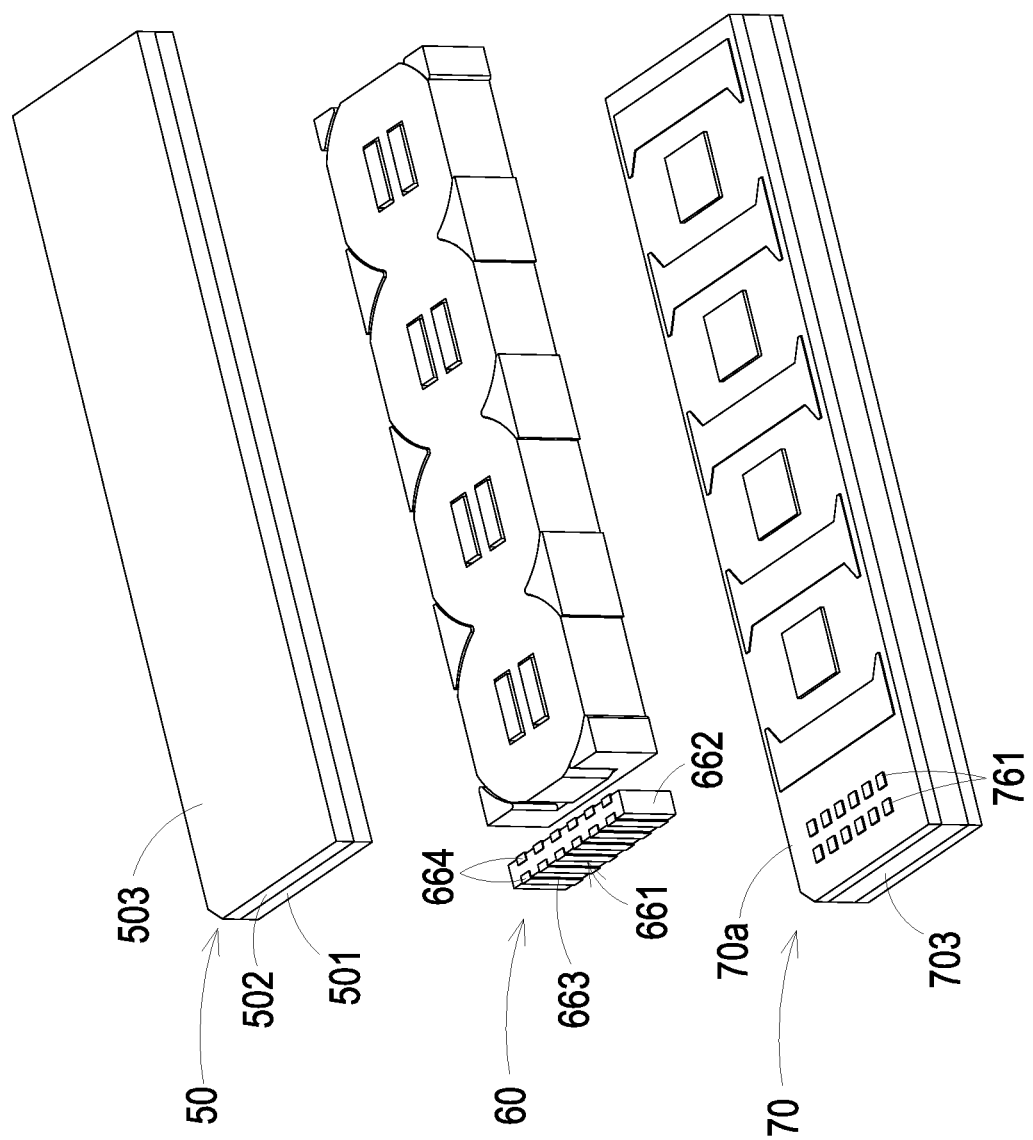
FIG. 9B is a schematic exploded view illustrating the voltage regulator module of FIG. 9A and taken along another viewpoint.
Figure 10:
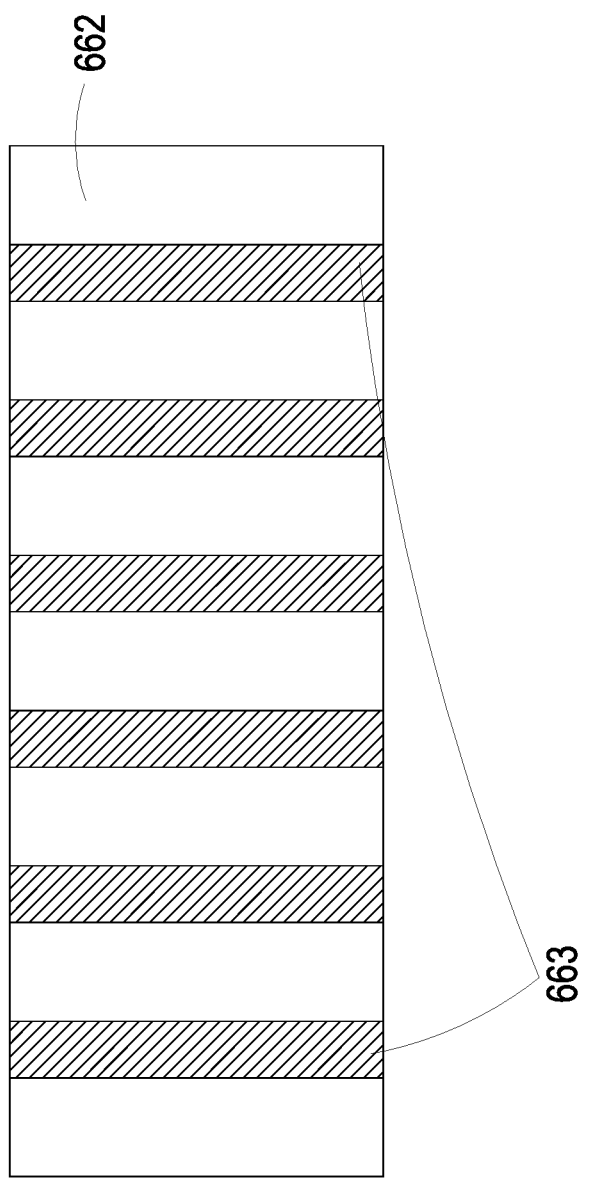
FIG. 10 is a planar view illustrating a signal communication part of the voltage regulator module as shown in FIG. 9A.

Please refer to FIGS. 9A, 9B and 10. FIG. 9A is a schematic exploded view illustrating a voltage regulator module according to a second embodiment of the present disclosure and taken along a viewpoint. FIG. 9B is a schematic exploded view illustrating the voltage regulator module of FIG. 9A and taken along another viewpoint. FIG. 10 is a planar view illustrating a signal communication part of the voltage regulator module as shown in FIG. 9A. Component parts and elements corresponding to those of the first embodiment are designated by identical numeral references, and detailed descriptions thereof are omitted. In comparison with the first embodiment, the signal communication part 661 does not includes the pins. Instead, the signal communication part 661 includes a conduction circuit board 662. In this embodiment, a plurality of conduction pads 561 are formed on the second surface 50*b* of the first printed circuit board 501 to replace the perforations and the blind holes. Similarly, a plurality of conduction pads 761 are formed on the second printed circuit board 703 to replace the perforations and the blind holes.

The conduction circuit board 662 includes a plurality of conduction fingers 663 and a plurality of surface pins 664. The plurality of conduction fingers 663 are located at a first lateral side and a second lateral side of the conduction circuit board 662, which are opposed to each other. Every two conduction fingers 663 that are aligned with each other and located at two opposite sides belong to the same power network or different power networks. For example, the conduction fingers 663 are gold-plated structures or tin-plated structures. The plurality of surface pins 664 are electroplated on the top side and the bottom side of the conduction circuit board 662. The top side and the bottom side of the conduction circuit board 662 are opposed to each other and arranged between the first lateral side and the second lateral side. The first ends of the conduction fingers 663 are contacted with the corresponding top-side surface pins 664. The second ends of the conduction fingers 663 are contacted with the corresponding bottom-side surface pins 664. In case that a first specified conduction finger 663 and a second specified conduction finger 663 located at the two opposite sides belong to different power networks, the surface pins 664 contacted with the first specified conduction finger 663 and the surface pins 664 contacted with the second specified conduction finger 663 are not electrically connected with each other.

The signal communication part 661 is arranged between the first circuit board assembly 50 and the second circuit board assembly 70 along a vertical direction. The signal communication part 661 is fixed on and electrically connected with the first circuit board assembly 50 through the conduction pads 561 and the corresponding surface pins 664. The signal communication part 661 is fixed on and electrically connected with the second circuit board assembly 70 through the conduction pads 761 and the corresponding surface pins 664.

As previously described, the signal communication part of the conventional voltage regulator module uses a plurality of fins to transfer signal, and thus some drawbacks occur. The signal communication part 661 of the voltage regulator module 3 of the present disclosure is specially designed. While the signal communication part 661 is welded on the bonding pads of the first circuit board assembly 50 or the second circuit board assembly 70, the lateral solder wicking efficacy is achieved and the soldering material is not spread to the adjacent pins. Since the soldering materials between the two surface pins 664 are not connected, the short-circuited problem is avoided. Under this circumstance, the gap between the adjacent surface pins 664 of the signal communication part 661 is reduced, and the pins distribution density is increased. Consequently, the volume of the voltage regulator module 3 is reduced, and power density of the voltage regulator module 3 is enhanced. Moreover, since the conduction circuit board 662 of the signal communication part 661 is decreased, the size of the signal communication part 661 is reduced and the overall size of the voltage regulator module 3 is reduced. Consequently, more space can be provided to mount other separate components (e.g., the output capacitors Cout). It is noted that numerous modifications and alterations may be made while retaining the teachings of the disclosure. For example, in another embodiment, the signal communication part 661 is electrically connected with the first circuit board assembly 50 or the second circuit board assembly 70 through a single-side wiring pattern or through the interconnect traces of the conduction circuit board.

In another embodiment, the signal communication part 661 is adhered on the magnetic core portion 610 or at least one of the first U-shaped copper structures 621, 623, 625, 627, the second U-shaped copper structures 603 and the third U-shaped copper structure 602 to define a signal communication module. The signal communication module 661 is directly installed between the first circuit board assembly 50 and the second circuit board assembly 70. Since the signal communication part 661 is adhered on the magnetic core portion 610 or at least one of the U-shaped copper structures, the perforations or blind holes can be omitted. In such way, the first circuit board assembly 50 and the second circuit board assembly 70 are not inclined during the welding process, the size of the voltage regulator module 3 is reduced, and production process is simplified. Moreover, since the conduction circuit board 662 of the signal communication part 661 is arranged vertically, the height of the conduction circuit board 662 can be adjusted more precisely. Under this circumstance, the smoothness of the contact surface between the magnetic core assembly 60 and the first circuit board assembly 50 (and the second circuit board assembly 70) will be enhanced.

As mentioned above, the plurality of ball grid arrays B are disposed on the second surface 70*b* of the second printed circuit board 703, and the first surface 70*a* of the second printed circuit board 703 (or the surface of the second printed circuit board 703 beside the magnetic core assembly 60) has to be welded and combined with the magnetic core assembly 60. In accordance with the conventional double-side reflow process, the first surface of the printed circuit board is coated with soldering paste and then the component is placed on the soldering paste. After a first reflow process is completed, the second surface of the printed circuit board is coated with soldering paste and the component is placed on the soldering paste. Then, a second reflow process is performed. However, when the second reflow process is performed on the second surface of the printed circuit board, the solder point on the first surface is heated and possibly molten. Under this circumstance, the component is detached from the printed circuit board. Especially when the component is large and weighty, the problem is more serious. For solving this problem, the temperature of the second reflow process is 5 degrees lower than the temperature of the first reflow process.

In accordance with the present disclosure, the second surface 50*b* of the first printed circuit board 501 is an internal welding surface, and the first surface 70*a* of the second printed circuit board 703 (or the surface of the second printed circuit board 703 beside the magnetic core assembly 60) is also an internal welding surface. After the voltage regulator module 3 is assembled, the second surface 70*b* of the second printed circuit board 703 has to be welded on the system board through the plurality of ball grid arrays B. Since the internal solder points of the voltage regulator module 3 are molten twice, the components are possibly shifted. The voltage regulator module 3 and the central processing unit are located at two opposite sides of the system board. After the voltage regulator module 3 is welded on the system board, the system board is turned over and then the central processing unit is welded on the system board. During the process of welding the central processing unit, the ball grid arrays B, the solder points on the first surface 70a of the second printed circuit board 703 or the solder points on the second surface 50b of the first printed circuit board 501 are molten again because of the large weight of the voltage regulator module 3. Meanwhile, the internal components of the voltage regulator module 3 are possibly detached.

For overcoming the above drawbacks, the magnetic core assembly 60 is fixed on the first circuit board assembly 50 and/or the second circuit board assembly 70 through a conductive adhesive. After the conductive adhesive is heated and solidified, the conductive adhesive is not molten or deformed again. Consequently, the problems of detaching or shifting the components during the welding process will be avoided, and the reliability and convenience of assembling the voltage regulator module 3 will be enhanced. Moreover, since the soldering material is replaced by the conductive adhesive, the number of the reflow processes is largely reduced and the product reliability is increased.

It is noted that numerous modifications and alterations may be made while retaining the teachings of the disclosure. For example, in another embodiment, the voltage regulator module is equipped with the first circuit board assembly 50 and the magnetic core assembly 60 and not equipped with the second circuit board assembly 70. Under this circumstance, the output capacitor Cout is mounted on the system board of the electronic device, and the bottom surfaces of the U-shaped copper structures of the magnetic core assembly 60 are directly welded on the corresponding bonding pads of the system board or fixed on the system board through the conductive adhesive. In other words, the second circuit board assembly 70 in the first embodiment or the second embodiment is replaced by the system board.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage regulator module, comprising:
   a first circuit board assembly comprising a first printed circuit board;
   a second circuit board assembly comprising a second printed circuit board, at least one output capacitor, a plurality of ball grid arrays and at least one bonding pad, wherein the second printed circuit board comprises a first surface and a second surface, the plurality of ball grid arrays are disposed on the second surface of the second printed circuit board, and at least one bonding pad is arranged beside the first surface of the second printed circuit board; and
   a magnetic core assembly arranged between the first circuit board assembly and the second circuit board assembly and electrically connected with the at least one bonding pad;
   wherein the at least one output capacitor is embedded within the second circuit board assembly;
   wherein the first circuit board assembly comprises a first printed circuit board, a plurality of switch elements, the plurality of switch elements are disposed on a first surface of the first printed circuit board;
   wherein the magnetic core assembly comprises a magnetic core portion and at least one first copper structure, wherein the magnetic core portion comprises a plurality of openings, and each of the at least one first copper structure is penetrated through two corresponding openings to define at least two inductors, wherein a first terminal of each inductor and the corresponding switch element are connected in series to define a phase circuit.

2. The voltage regulator module according to claim 1, wherein the at least one output capacitor is embedded within the second printed circuit board.

3. The voltage regulator module according to claim 1, wherein the at least one output capacitor is disposed in the second circuit board assembly through a plastic molding process.

4. The voltage regulator module according to claim 3, wherein the second circuit board assembly further comprises a plurality of copper blocks and a second molding compound layer, wherein the plurality of copper blocks are fixed on the first surface of the second printed circuit board to provide a supporting function, and the first surface of the second printed circuit board, the at least one output capacitor and the plurality of copper blocks are encapsulated by the second molding compound layer through the plastic molding process, wherein a top surface of each copper block is exposed outside the second molding compound layer to form the at least one bonding pad.

5. The voltage regulator module according to claim 4, wherein each of the copper blocks has a rectangular structure.

6. The voltage regulator module according to claim 4, wherein each of the copper blocks has a trapezoid column structure with a bottom surface and a top surface, wherein the bottom surface and the top surface are parallel with each other, and an area of the bottom surface is smaller than an area of the top surface, wherein the bottom surface of the trapezoid column structure is fixed on the first surface of the second printed circuit board, the top surface of the trapezoid column structure is exposed outside the second molding compound layer, and the at least one bonding pad is electroplated on the top surface of the trapezoid column structure.

7. The voltage regulator module according to claim 6, wherein the area of the top surface of the trapezoid column structure is at least 1.3 times the area of the bottom surface of the trapezoid column structure.

8. The voltage regulator module according to claim 1, wherein the first circuit board assembly further comprises a first molding compound layer, the first molding compound layer is formed on the first surface of the first printed circuit board to encapsulate the plurality of switch elements, wherein the at least one first copper structure is U-shaped.

9. The voltage regulator module according to claim 8, wherein the magnetic core assembly further comprises at least one second U-shaped copper structure and a third U-shaped copper structure, wherein a height of the magnetic core portion is lower than a height of the first U-shaped copper structure, a height of the second U-shaped copper structure and a height of the third U-shaped copper structure.

10. The voltage regulator module according to claim 9, wherein two first bonding pads and at least one pair of second bonding pads are disposed on the second surface of the first printed circuit board, and the second circuit board assembly further comprises a fourth bonding pad and at least one fifth bonding pad, wherein the first bonding pads and the fourth bonding pad are electrically connected with a positive input end of the voltage regulator module, the second bonding pads and the at least one fifth bonding pad are electrically connected with a negative output terminal of the voltage regulator module, the third U-shaped copper structure is fixed on and electrically connected with the two first bonding pads and the fourth bonding pad, each second U-shaped copper structure is fixed on and electrically connected with the corresponding pair of second bonding pads and the corresponding fifth bonding pad, and the first circuit board assembly and the second circuit board assembly are supported by the at least one first U-shaped copper structure, the at least one second U-shaped copper structure and the third U-shaped copper structure.

11. The voltage regulator module according to claim 8, wherein an even number of third bonding pads are disposed on the second surface of the first printed circuit board, and the second circuit board assembly further comprises at least one sixth bonding pad, wherein each third bonding pad is electrically connected with the first terminal of the corresponding inductor, the at least one sixth bonding pad is electrically connected with a positive output terminal of the voltage regulator module, and each first U-shaped copper structure is fixed on and electrically connected with the corresponding two third bonding pads and the corresponding sixth bonding pad.

12. The voltage regulator module according to claim 8, wherein the magnetic core assembly is fixed between the first circuit board assembly and the second circuit board assembly through a conductive adhesive.

13. The voltage regulator module according to claim 8, further comprising an input capacitor, wherein the input capacitor is disposed on the first surface of the first printed circuit board and encapsulated by the first molding compound layer, wherein a first terminal of the input capacitor is electrically connected with a positive input end of the voltage regulator module, and a second terminal of the input capacitor is electrically connected with a negative input end of the voltage regulator module.

14. The voltage regulator module according to claim 8, wherein an external surface of the first molding compound layer is a flat surface.

15. The voltage regulator module according to claim 14, wherein each of the plurality of switch elements is a driver and metal-oxide-semiconductor field-effect transistor, and the driver and metal-oxide-semiconductor field-effect transistor comprises a first heat dissipation surface and a second heat dissipation surface, wherein the first heat dissipation surface and the second heat dissipation surface are opposed to each other, the first heat dissipation surface is in contact with the first surface of the first printed circuit board, and the second heat dissipation surface is exposed outside the external surface of the first molding compound layer.

16. The voltage regulator module according to claim 1, wherein a plurality of perforations and a plurality of first blind holes are formed in the first printed circuit board, and a plurality of second blind holes are formed in the second printed circuit board, wherein the voltage regulator module further comprises a signal communication part with a plurality of pins, and the plurality of pins are divided into a first pin group and a second pin group, wherein first terminals of the pins in the first pin group are fixed in the corresponding perforations of the first printed circuit board, first terminals of the pins in the second pin group are fixed in the first blind holes of the first printed circuit board, second terminals of the plurality of pins are fixed in the corresponding second blind holes of the second printed circuit board, and a control signal is transmitted between the first circuit board assembly and the second circuit board assembly through the signal communication part.

17. The voltage regulator module according to claim 1, wherein a plurality of first conduction pads are formed on the first printed circuit board, a plurality of second conduction pads are formed on the second circuit board assembly, the voltage regulator module comprise a signal communication part with a conduction circuit board, and the conduction circuit board comprises a plurality of conduction fingers and a plurality of surface pins, wherein the plurality of conduction fingers are formed on at least one lateral side of the conduction circuit board, the plurality of surface pins are electroplated on a top side and a bottom side of the conduction circuit board, a first end of each conduction finger is contacted with the corresponding surface pin on the top side, and a second end of each conduction finger is contacted with the corresponding surface pin on the bottom side, wherein the signal communication part is arranged between the first circuit board assembly and the second circuit board assembly along a vertical direction, the signal communication part is fixed on and electrically connected with the first circuit board assembly through the first conduction pads of the first printed circuit board and the corresponding surface pins, the signal communication part is fixed on and electrically connected with the second circuit board assembly through the second conduction pads of the second circuit board assembly and the corresponding surface pins, and a control signal is transmitted between the first circuit board assembly and the second circuit board assembly through the signal communication part.

\* \* \* \* \*